United States Patent [19]

Cole

[11] Patent Number: 5,122,731

[45] Date of Patent: Jun. 16, 1992

[54] METHOD AND APPARATUS FOR FREQUENCY SPECTRUM ANALYSIS

[75] Inventor: Steven W. Cole, Covina, Calif.

[73] Assignee: The United States of America as represented by the Administrator, National Aeronautics and Space Adnministration, Washington, D.C.

[21] Appl. No.: 660,371

[22] Filed: Feb. 25, 1991

[51] Int. Cl.⁵ ............................................. G01R 23/16
[52] U.S. Cl. ............................. 324/77 C; 324/77 CS; 324/78 F; 324/78 D
[58] Field of Search ............. 455/36; 324/77 A, 77 B, 324/77 C, 77 CS, 78 D, 78 F; 370/74, 70, 123

[56] References Cited

U.S. PATENT DOCUMENTS

| | | | |
|---|---|---|---|
| 2.769,595 | 11/1956 | Bagley | 324/78 D |
| 3.634,760 | 1/1972 | Murtin et al. | |
| 3.891.920 | 6/1975 | Williams | |
| 3.903,401 | 9/1975 | Jayant | |
| 4.031,462 | 6/1977 | Bouvier et al. | |
| 4.093,989 | 6/1978 | Flink et al. | |
| 4.430,611 | 2/1984 | Boland | 324/77 B |
| 4.598,293 | 7/1986 | Wong | |
| 4.607,216 | 8/1986 | Yamaguchi et al. | |
| 4.611,164 | 9/1986 | Mitsuyoshi et al. | |
| 4.611,343 | 9/1986 | Rapaich | |
| 4.634,966 | 1/1987 | Nakatani et al. | |
| 4.639,680 | 1/1987 | Nelson | |
| 4.644,268 | 2/1987 | Malka | 324/77 A |
| 4.668,910 | 5/1987 | Stepp | 324/77 B |
| 4.672,308 | 6/1987 | Leikus | |
| 4.720,673 | 1/1988 | Hatfield | |
| 4.771,232 | 9/1988 | Betts | 324/77 B |
| 4.802,098 | 1/1989 | Hansen et al. | |
| 4.839,583 | 6/1989 | Takano et al. | |

Primary Examiner—Kenneth A. Wieder
Assistant Examiner—Jose M. Solis
Attorney, Agent, or Firm—Thomas H. Jones; John R. Manning; Guy Miller

[57] ABSTRACT

The invention relates to a method and apparatus for frequency spectrum analysis of an unknown signal in real time based upon integration of 1-bit samples of signal voltage amplitude corresponding to sine or cosine phases of a controlled center frequency clock used to time the samples taken, but preferably corresponding to both sine and cosine phases of the center frequency clock which is changed after each integration interval to sweep the frequency range of interest in steps. Integration of samples during each interval is carried out over a number of cycles of the center frequency clock spanning a number of cycles of an input signal to be analyzed. The invention may be used to detect the frequency of at least two signals simultaneously. By using a reference signal of known frequency and voltage amplitude (added to the two signals for parallel processing in the same way, but in a different channel with a sampling at the known frequency and phases of the reference signal), the absolute voltage amplitude of the other two signals may be determined by squaring the sine and cosine integrals of each channel and summing the squares to obtain relative power measurements in all three channels and, from the known voltage amplitude of the reference signal, obtaining an absolute voltage measurement for the other two signals by multiplying the known voltage of the reference signal with the ratio of the relative power of each of the other two signals to the relative power of the reference signal.

11 Claims, 2 Drawing Sheets

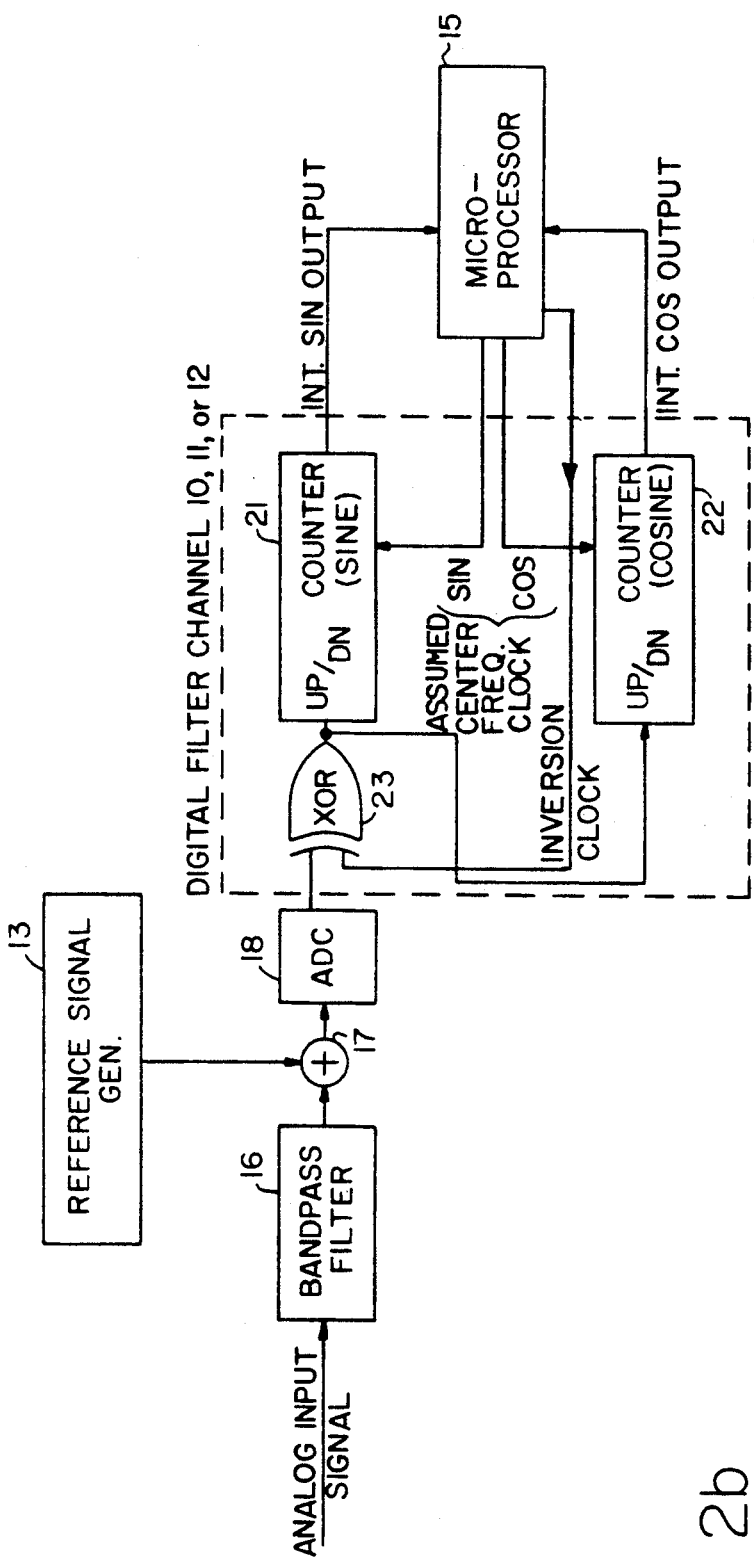

METHOD AND APPARATUS FOR FREQUENCY SPECTRUM ANALYSIS

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

The invention relates to a method and apparatus for frequency spectrum analysis in real time of an unknown signal to determine the presence in the unknown signal of one or more signals of interest in a limited frequency band. The method is based upon conversion of the unknown signal from analog to a 1-bit digital signal using a zero-crossing voltage comparator, and sampling the digital signal at sine or cosine phases of an assumed central frequency clock, and preferably at positive and negative sine and cosine phases of the assumed center frequency clock, and sweeping the assumed center frequency clock over a fequency band of interest by stepping to a new center frequency clock after each interval of sampling and integrating samples over a number of cycles of the unknown signal. Detection of the center frequency clock which yields the greatest integration of positive and negative sine and cosine samples in the band of interest yields an indication of the presence of a signal at a frequency of interest in the unknown signal.

BACKGROUND ART

In a system for the Simulation of Area Weapons Effects (SAWE), conventional land-mine effects are simulated by a Mine Effects Simulator (MES) to provide sensory cues for force-on-force, free-play combined arms field training exercises and other purposes. When a MES is detonated by a player, finely-divided inert powder is expelled with an audible bang as a smoke cue while a commercial flash bulb or flash powder is triggered to generate a flash cue that illuminates the smoke cue.

Single-shot, throw-away MES devices are planted on the terrain to simulate land mines. Just prior to detonation, an acoustic warning whistle is generated by the MES in the range of 2.8 kHz to 4.2 kHz for a period of about two seconds as a safety warning to personnel. Two frequencies are generated in each MES, and both decrease in frequency with time during the two seconds. Antipersonnel MES use tones A and B separated in frequency by 400 Hz, whereas antitank MES use tones A and C separated in frequency by 800 Hz. An acoustic warning whistle just prior to detonation will thus include tone A and tone B or C. While both tones A and B or C are to be detected, it is the difference in frequency for the second tone B or C as compared to tone A that is relied upon to determine whether it is an antipersonnel or an antitank mine that is being detonated. Thus, by setting the second tone of the warning whistle emitted by antipersonnel and antitank MES devices at different frequencies within the limited range and using Player Detector Devices (PDD's), real-time casualty assessment is possible after each MES detonation during training exercises. The two-second duration of the warning whistle allows the PDD to assess the acoustic tone received from a MES device through a microphone on the PDD. Consequently, assessment of the tones has a profound effect upon reliability of the real-time casualty assessment during field training exercises.

The longer the duration of the analysis, the greater the reliability of the PDD in rejecting false sounds, but the more it becomes possible to fail to record a "kill" of a fast moving vehicle that has set off a MES device because one to two seconds after running over a MES it could be outside the 10-meter casualty radius at the time of the audible bang, smoke expulsion and light flash. The selected timing of the SAWE-MES from the moment (T=0) the MES device is triggered is as follows:

$T_W = 0.8$ sec time to initiation of whistle at near full volume, $T_B = 2.9$ sec to initiation of a bang, and $T_F = 3.4$ sec to initiation of a flash.

The total time of the whistle warning at full volume before the bang is thus about 2 seconds with only another period of 0.5 sec before the flash. As a consequence, the Player Detector Device (PDD) has only about two seconds to detect the two-tone whistle and identify it as an antipersonnel mine simulator or an antitank mine simulator in order to accurately record a kill. This identification is important because an antipersonnel mine simulated by a MES device should not be recorded by a PDD carried on a tank. Thus, the problem addressed by the present invention is the prompt detection of two acoustic signals in a limited range (e.g., from 2.8 kHz to 4.2 kHz) in the presence of other acoustic signals and noise in general, and the proper identification of which tone signals have been received and periodically determining the difference in frequency between the two tones for the two-second duration of the whistle.

In the past, the PDD has been implemented with a Digital Signal Processor (DSP), a class of special purpose digital computers programmed for signal spectral analysis using a conventional Fast Fourier Transform (FFT) which, for real-time spectral analysis, depended upon high speed multiplication to detect the presence of the acoustic signals of predetermined tones. That implementation was too complex and required too much power for field use in PDDs of a SAWE-MES system. What is required is a less expensive PDD that requires less physical size, weight and operating power.

U.S. Pat. No. 4,031,462 is typical of prior-art real-time frequency analysis of a signal of unknown frequency characteristics utilizing a code generator responsive to a timing signal to generate a series of repetitive frames of sampling pulses, where each frame represents a series of cross-correlation functions in terms of a predetermined number of sampling intervals and a predetermined number of harmonics defined by a two-dimensional sample weighting matrix formed by approximating a series of harmonically related cross-correlation functions in which each column of the matrix corresponds to a different sampling interval, while each row corresponds to a different harmonic of the cross-correlation function. These sampling pulses are then multiplied with the incoming signal to generate a train of discrete sampled outputs which are accumulated.

During each successive sampling interval, the code generator scans a successive column of the sampled weighting matrix to generate a series of harmonically related cross-correlation functions. The scanning sequence is repeated with each sampling pulse produced by the code generator being a function of the sampling interval and the harmonic of the cross-correlation function. After the scan of the last column of each scanning sequence, the accumulated output represents the desired frequency spectrum of the unknown signal based upon the multiplication of an unknown time domain signal with a series of signals of known frequency, where each product is integrated over a finite time period.

U.S. Pat. No. 4,093,989 discloses in FIG. 3 the basic concept of a proportional bandwidth spectrum analyzer comprised of a bandpass (BP) filter for sampling the signal at a known frequency and then processing the digital samples using a Fast Fourier Transform algorithm, and in FIG. 4 the implementation of a proportional bandwidth analysis that overcomes limitations of multiplier speed and memory capacity. A controller in the digital processor selects the bandwidth of the low-pass filter and selects the sampling frequency, both of which must be known in order for the processor to carry out spectrum analysis. The analysis range is separated into a number of ranges, e.g., 0-20 kHz, 0-2000 Hz and 0-200 Hz, and a block of samples is collected for each range. Each block is multiplied by a weighting function before processing in a serial-parallel fashion by digital filtering, squaring and integrating. The effect of the weighting function is to contain the spectral energy of a short data block of a sinewave within the bandpass filter.

These references underscore the limitations of the prior art in the multiplier and memory capacity required for spectrum analysis using known techniques. An object of the present invention is to provide a method and apparatus for real-time frequency spectrum analysis free of these limitations.

STATEMENT OF THE INVENTION

In accordance with the present invention, a novel underlying algorithm for a digital filter channel calls for a 1-bit Analog-to-Digital Converter (ADC) which may be implemented by a zero-crossing voltage comparator, sampling an analog signal at the sine and the cosine phases of a controlled center frequency clock, and preferably at both the plus and minus sine and cosine phases of the controlled center frequency clock which is swept in steps during analysis, one step per interval of integration of multiple samples, and integrating the samples to determine the frequency of a signal present based upon the center frequency clock that provides the highest integral of sine and cosine samples. Implementation of that distinct algorithm requires much less circuit complexity by providing for all samples to be 1-bit samples (binary 1 or 0) so that integration may be readily accomplished with up/down counters.

A reference signal of known frequency and amplitude is summed with at least the signal or signals to be frequency analyzed using separate channels of counters for each signal. Consequently, the center frequency sine and cosine clock generated by the microprocessor for the reference channel is always constant, while the center frequency sine and cosine clock generated by the microprocessor for the two signals of unknown frequencies are swept in steps in order to detect the reference frequency signal in the reference channel and the two unknown signals in the other two channels.

The sum of the sine or cosine 1-bit samples in each filter channel after an integration interval determines the degree of correlation of the input signal to the center frequency control clock used during the integration interval. The greater the sum the greater the correlation. This relationship is used to determine the frequency of the input signal of the particular filter channel by determining the center frequency control clock which produces the highest integral. As noted above, it is preferred to sum both sine and cosine samples and preferably to sum four samples of the controlled center frequency clock at 90°, 180°, 270° and 360° of the assumed center frequency during each integration interval by summing samples at the sine and cosine phase and inverting samples at the −sine and −cosine phase of the frequency clock before summing. This arrangement obviates the necessity of a complex digital signal processor requiring a large memory to perform an analysis of the entire spectrum in order to get to any part of the spectrum by examining one frequency at a time and producing an independent analysis of each apart from the rest of the spectrum.

The sum of the squares of the sine and cosine samples (or some approximation thereof) can be formed for each of the two unknown signals and the reference signal to produce values proportional to the power of each, and the known amplitude of the reference signal may be multiplied by the ration of the power of the corresponding signal to the power of the reference signal to produce a measurement of the voltage amplitude of the unknown signals.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 2a is a functional block diagram in greater detail of the spectrum analyzer shown in FIG. 1 for each filter channel, and FIG. 2b illustrates a center frequency control clock separately generated for timing sine and cosine counts in each filter channel.

DETAILED DESCRIPTION OF THE INVENTION

Figure 1:
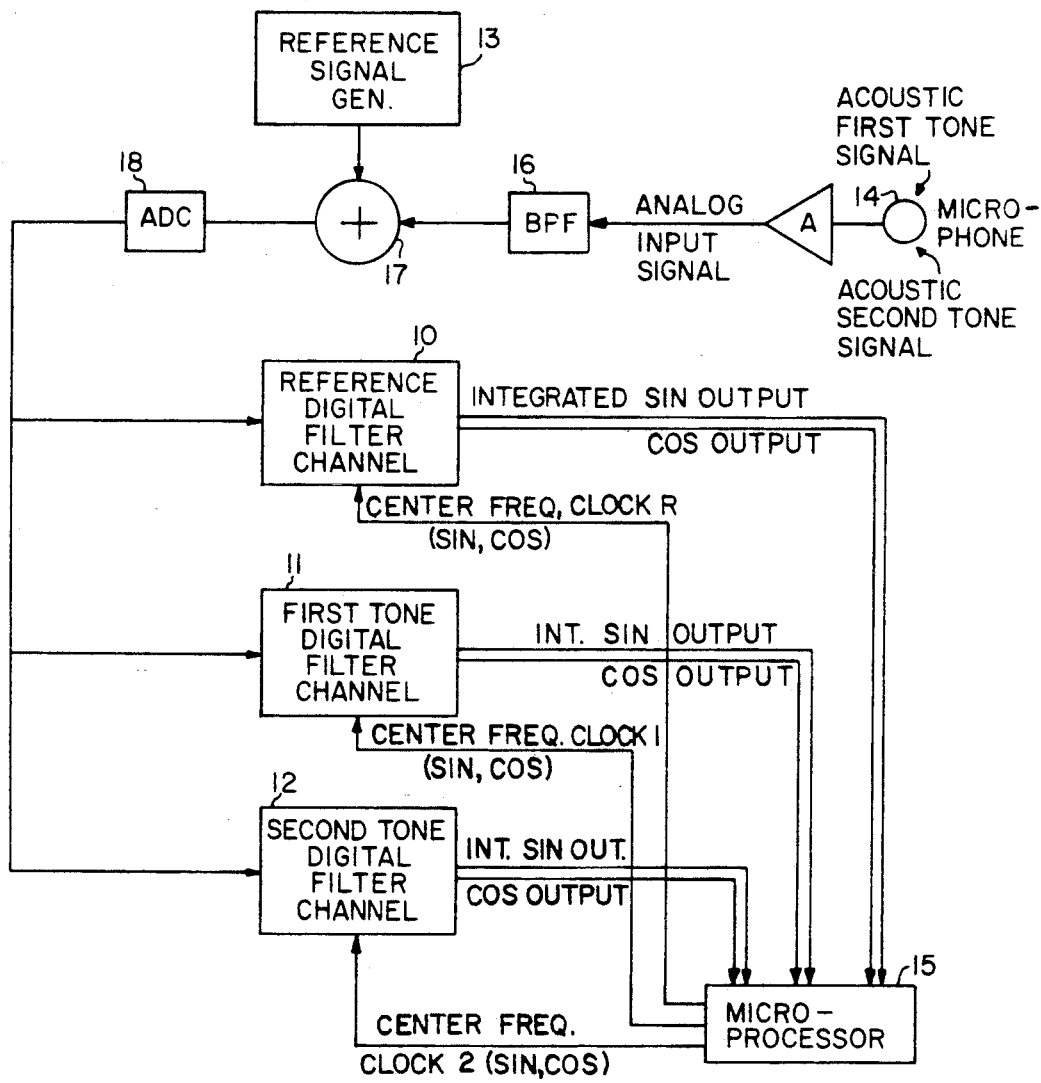
FIG. 1 is a functional block diagram of a spectrum analyzer according to the present invention.

For a better appreciation of the invention, the practical application previously referred to briefly will be retained, namely the application of frequency spectrum analysis for a Mine Effects Simulator (MES) specific Player Detector Device (PDD) employed as a part of a Simulation of Area Weapon Effects (SAWE) system. The PDD is required to detect within about two seconds the presence of two distinct acoustic signals of different tones in the frequency range from 2.8 kHz to 4.2 kHz in the presence of other signals and noise and determine the difference between the two tones detected in order to determine which type of mine has been detonated. However, the technique of quickly and economically identifying the presence of any signal (which corresponds to the input signal received through a microphone in the present application) of one or more unknown frequencies within a limited range may have other applications. It is therefore the specific technique disclosed rather than its disclosed application that is regarded as the invention set forth in the claims.

Referring to FIG. 1, a plurality of digital filter channels 10, 11, and 12 are shown, but it should be understood at the outset that these are not filter channels in the usual definition of the term, i.e., these are not filters that remove unwanted frequency components from an input signal yielding an output signal of the same form as the input signal, but of narrower frequency band. Instead, the output of each filter channel is a measure of the sine and cosine voltage present at a particular frequency within the applied signal. Without this qualification in mind, the term "filter channel" can lead to a misunderstanding of the invention.

In operation, a swept center frequency clock (sometimes referred to hereinafter as an "assumed center frequency") is applied to each input channel 11 and 12 for analysis of the input signal frequencies. The assumed center frequency clock of each is swept in steps to allow a plurality of samples to be taken over a number of cycles of the input signal in search of the center frequency at which the greatest input signal content is found, i.e., the assumed center frequency at which the integral of samples during an integration interval is maximum. The assumed center frequency R of the reference filter channel 10 is not swept. Instead it is generated at the constant frequency and phase of a reference signal from a reference signal generator 13. Thus, there are two signal sources in the PDD. One source is the microphone 14 which receives acoustic signals that include two different tones in this application, and the other source is the reference signal generator 13.

Channel 10 is used to integrate the sine and cosine 1-bit samples of the reference tone frequency signal of known amplitude produced by the generator 13 in the PDD, and the other channels 11 and 12 are used to integrate the sine and cosine 1-bit samples of first and second tones present in the input signal from which it is possible to determine which type of mine has been detonated. It is also possible to determine the power and/or voltage of separate acoustical input signals that may be detected within the analog input signal from a microphone 14. Each digital filter channel integrates both sine and cosine samples of the analog input signal using the center frequency clock generated by a general purpose microprocessor 15 included in the PDD.

The reference signal produced internally by the generator 13 has a known phase relationship with respect to center frequency clock signal R from the microprocessor 15. Consequently, implementation of the reference channel can be further simplified by implementing integration of only sine or cosine samples of the 1-bit ADC output rather than both sine and cosine samples. Both are shown to be implemented to illustrate the more general case of an unknown phase relationship between the reference signal and the center frequency clock signals.

The center frequency clock R for the digital filter channel of the local reference signal is set by the microprocessor at the known frequency of the reference signal generator while the center frequency clock 1 for the first tone signal and the center frequency clock 2 for the second tone signal are swept in steps, one step per sampling interval of multiple input signal cycles. The center frequency clocks are swept by the microprocessor 15 for a spectrum analysis conducted by examining one frequency at a time selected for the swept center frequency clock for each channel in the frequency band of interest or selected portions of that band.

The analog input signal is first amplified by an amplifier A and then passed through an analog bandpass filter (BPF) 16 to reduce aliasing for all channels, i.e., to limit the working frequency range to 2.5–4.5 kHz, and then added to the reference signal in a circuit 17 as shown. The combined signals are then applied to the input of a 1-bit Analog-to-Digital Converter (ADC) 18 which acts both as a zero-voltage crossing comparator and as an automatic gain control circuit. The power of the tone signal detected by each digital filter channel 11 and 12 can be determined from the integrated sine and cosine samples by forming the sum of their squares and the absolute voltage amplitude of the tone signal may then be determined from a ratio of the square root of the sum of the squares of the tone signal to the square root of the sum of the squares of the reference signal multiplied by the known voltage amplitude of the reference signal. This determination is accomplished by the microprocessor 15. The basis for this will be understood from the following discussion.

The output of the ADC (zero-crossing voltage comparator) 18 will have a constant power amplitude regardless of what signals are added in the circuit 17. The fixed power amplitude of that comparator output will be divided between the signals of different frequencies added according to their relative amplitudes. The larger signal will cause more power to be present at its frequency, and the smaller signals will be allotted correspondingly less power, but the total power remains the same. The center frequency clock applied to the filter channels sample the sine and cosine phases of the frequency clock applied to analyze the combined reference and input signal or signals, preferably four times per cycle at the +sine, +cosine, −sine and −cosine phases. As the samples are integrated for each cycle, the −sine and −cosine samples are inverted so that they are arithmetically added. The filter channels thus yield an integration of absolute sine samples at 90° and 270° and cosine samples at 180° and 360° reflecting relative power amplitudes when squared and summed. By taking the square root of the power of the largest one (which will be the reference signal power) and the square root of the power of either one of the signals added with the reference, a ratio of relative voltage amplitude is obtained. Since the voltage amplitude of the reference signal is known, the voltage amplitude of the other signals is determined from that ratio. While only two unknown signals are added to the reference signal in this example of the invention, the technique of determining the voltage of any one of three or more signals added to the reference will, in theory, apply with the limitation that the voltage amplitude of each signal added be above the noise level of the system.

In the Simulation of Area Weapons Effects (SAWE), there will always be two tones in the acoustic signal received through the microphone, so each of the channels 11 and 12 will detect a different frequency, i.e., will produce a maximum integration of sine and cosine samples over a sampling interval at a different center frequency clock, the sampling interval being over a predetermined number of center frequency clock cycles. Consequently, the ratio of the square root of the sum of the squares of the sine and cosine integration of 1-bit samples may be used to determine the voltage amplitude $V_T$ of the input tone signal from the known voltage amplitude of the reference signal $V_R$, thus: $V_T = (A/B)V_R$, where A is the square root of the sum of the squares of the output of the tone channel 11 or 12, B is the square root of the sum of the squares of the reference channel 10 of interest. Thus, when two tone signals at different frequencies are added to the reference signal, the total power output of the ADC (zero-crossing voltage comparator) 18 is simply divided among the three combined input signals according to their relative amplitudes.

Signals at three times the center frequency of a channel alias into the channel's passband could be measured as though they were at the center frequency of the channel. Signals at ⅓ the center frequency are also detected, but at a reduced level. Consequently, the useful frequency spectrum of this invention is limited to about 1 octave. The two digital filter channels 11 and 12 can be used to scan this limited frequency spectrum and in some applications track signals found there. Continuous tracking is made possible by using the phase roll of a measured signal as an error signal to correct the center frequency control clocks. Noncontinuous tracking is possible using the amplitude of adjacent frequencies to develop the center frequency control clock, which has as an advantage that it allows more signals to be tracked than there are digital filter channels.

Each digital filter channel 10, 11 or 12 is comprised of a pair of up/down counters 21 and 22 as shown in FIG. 2a. Each counter is clocked twice per cycle of a center frequency clock generated by the microprocessor 13. One counter is clocked at the sine (90°) and −sine (270°) phases of the center frequency clock. The other is clocked at the cosine (180°) and −cosine (360°) phases of the center frequency clock.

Whether the counters count up or down when clocked is determined by the value of the input signal from the ADC (zero-crossing voltage comparator) 18 and an inversion clock shown in FIG. 2b generated by the microprocessor 15 in conjunction with the sine or cosine center frequency clocks. If the input signal is high (above zero) at the time of the +sine clock pulse, the sine counter 21 will increment. The count direction of the counter 21 is inverted by the inversion clock for the −sine clock pulse so that a low input (below zero) will also increment the counter when the −sine clock pulse occurs. Thus, arithmetic addition of the −sine samples to the +sine samples is achieved by the effect of the inversion clock, i.e., the plus and minus sine clock samples are effectively transformed into two plus sine clock samples per center frequency clock cycle by the inversion clock shown in FIG. 2b. If the input signal is of the same frequency as the filter center frequency clock, a maximum count will result in the counter 21; otherwise a lower count will result. This up/down count control is implemented for both the sine up/down counter 21 and the cosine up/down counter 22 using an exclusive-OR gate 23 with the inversion clock applied at one terminal of the gate from the microprocessor 15 to assure addition of absolute samples for both the sine and cosine clocks shown in FIG. 2b. The cosine counter 22 counts up and down with the +cosine and −cosine clock pulses which, like the +sine and −sine clock, are effectively transformed into two +cosine clocks per center frequency cycle.

The integrated count of samples can be either a positive value or a negative (2's complement) value. The amplitude and sign of the two counter values indicate the amplitude and phase angle of the input signal with respect to the micrprocessor controlled center frequency clock.

The effective input signal to the exclusive-OR gate 23 from the ADC (zero-crossing voltage comparator) 18 is a squarewave. Consequently, the sine and cosine amplitudes of added signals may not combine properly if only one tone signal is added to the reference signal. As the number of input tones increase, such as with the addition of the second tone and/or noise in the PDD channel circuits, the sine and cosine values approach the classical relationship over a period of several cycles of the input signal. In this SAWE application, there will always be a second tone signal, as noted above, so that the sine and cosine amplitudes of all the signals will combine properly and there need not be reliance upon noise for this frequency analysis of input signals to function with the accuracy required by the SAWE application, which is less than laboratory accuracy.

THEORY OF OPERATION

In order to better understand this invention, the underlying theory of operation will now be discussed. The well known aliasing phenomenon of sampled signals makes one frequency appear as though it were a different frequency. This occurs when a frequency is sampled at less than twice its fundamental frequency. If, for instance, a sinewave is sampled at the positive peak of each cycle, the resulting data set looks like a positive DC voltage has been applied as the analog input signal. However, the method described above employs a center frequency control clock that creates a sampling rate near the fundamental of the frequency to be examined, which may be referred to as the center frequency of the digital filter channel.

Assume that a sinewave analog input signal is applied to a sampling device like an Analog-to-Digital Converter (ADC). Samples taken at the fundamental frequency of the applied analog input signal can be integrated to form a measurement. If the samples fall on the peak, the peak amplitude of the wave is measured. Changing the frequency of the applied analog input signal without changing the sampling frequency causes the amplitude of the ADC sample output signal to roll in phase. When the samples are integrated, the integral approaches zero. A digital filter may be implemented based on this observation, but instead of the frequency of the input signal changing for the particular SAWE application, the sampling frequency is changed. After determining the input signal frequency, the mode of control over the sampling frequency may be changed from sweeping the sampling frequency for the purpose of determining the input signal frequency to tracking the input signal frequency.

There are several problems in the digital filter theory described thus far. The sample clocks might not fall on the peaks of the applied input signal. This is overcome by sampling at points corresponding to both the sine and the cosine of the filter center frequency, i.e., the sine and cosine of the clock frequency being tested and summing them separately into two integrals. At the end of the integration interval, the two integrals are summed. The frequency of the unknown signal is determined to be the clock frequency tested which produces the largest sum of the sine and cosine integrals.

In the present invention, the samples are values taken from the output of a zero-crossing voltage comparator functioning as 1-bit ADC rather than a measure of instantaneous amplitude, i.e., the zero-crossing voltage comparator is used to implement the Analog-to-Digital Converter 18 required in this discussion of theory. Counters 21 and 22 are incremented or decremented to integrate the sine and cosine samples. The measure of voltage amplitude at the filter frequency (which is set by the center frequency clock generated by the micrprocessor 15) during any sample integration interval is the amplitude of the counters at the end of the integration interval (which is also set by the microprocessor 15).

A second problem with the digital filter theory as described thus far is that a DC voltage in the applied input signal will appear as a signal made up of all frequencies. To solve this problem, samples are taken 4 times per cycle of the center frequency clock, i.e., every 90 degrees of the center frequency control signal using the sine, cosine, −sine and −cosine clock pulses shown in FIG. 2b. The samples that are 180 degrees out of phase with the sine and cosine samples, namely the −sine and −cosine samples, are substracted from the sine and cosine integrals in the counters 21 and 22. Thus, a DC signal will integrate to zero. A side benefit is that half as many cycles of the applied signal are required to be sampled for a desired filter width. A second advantage is that it pushes the lowest aliasing frequency of the filter from twice the center frequency of the filter to three times the center frequency. This increases the effective bandwidth to one octave as described above.

The number of cycles of the analog input signal to be sampled and integrated in the sample period must be carefully selected. The width of the digital filter implemented by this up/down counter method is determined by the number of cycles in the sampling period. A long sample period creates a very narrow filter. This has two drawbacks. First, the analysis process takes longer for each frequency tested so fewer frequencies can be analyzed in a unit of time. Second, more frequencies must be analyzed to cover a specific range of frequencies. If too few cycles are present in the sampling interval, the resulting filter is wide and the signal-to-noise ratio (SNR) is adversely effected.

ADVANTAGES

This method of utilizing a bank of digital filter channels for signal spectrum analysis has advantages over other spectrum analysis methods. As implemented in FIGS. 1 and 2a, this method forms a digital, swept frequency analyzer microprocessor controlled, which may also be used as a tracking filter. The microprocessor sweeps the center frequency clock by setting it to a different center frequency to be tested for successive sampling intervals and noting the counts in the counters 21 and 22 at the end of each sampling interval before going to the next frequency to be tested. The method has much less drift than an analog filter design because the microprocessor can correct for any analog drift which may occur. The system also requires much less power than would be required by any other implementation.

The method described here is superior to an FFT analyzer in three ways. First, the entire spectrum need not be processed to determine the presence of one of the tones expected in the limited range of 2.8 kHz to 4.2 kHz with this method as opposed to an FFT which uses a complex structure for the many multiplications required to examine the entire data set. Because the result of one multiplication is used in the next by the FFT, processing of the entire spectrum must be completed to get any part of the spectrum. Each channel of the present invention examines one frequency of the spectrum at a time, as specified by the microprocessor, and for each frequency produces an independent result. Thus, only a small part of the spectrum need be analyzed to produce meaningful information.

The second advantage is speed, reduced complexity and low power requirements. An FFT requires many complex multiplications, as noted above. Doing an FFT or other cross-correlation analysis with most microprocessors is a time consuming task. A math coprocessor can speed the calculations but at the cost of increased complexity and power. This digital filter method merely increments and decrements counters in hardware to arrive at the counts required for analysis of each frequency to be tested; only the frequency tested that produces the maximum sum of the counts need be processed further to determining the absolute amplitude of the input signal. Thus, arithmetic operations by the microprocessor need not be involved until after most of the processing is complete. This allows the spectrum to be analyzed rapidly without the need of a math coprocessor.

The third advantage of the method over an FFT or other cross-correlation analysis is that the width of the individual filters can be varied as needed. A wider filter can be used initially to scan the spectrum for frequencies of interest. The filter can then be narrowed to perform a track operation, if one is desired. The frequency testing steps, filter width and the total number of samples per frequency tested are all interrelated in an FFT or other cross-correlation analysis. A change in one effects all three so that it is not possible to start with a wide filter and then switch to a narrow filter mode of operation.

One disadvantage of this method is that only one frequency band is analyzed in each filter channel during the same analysis period. This may give false information about a signal which varies rapidly in either frequency or amplitude. However, the PDD in the SAWE application does not have this problem since the signal to be detected does not vary rapidly in either frequency or amplitude relative to the rate at which the center frequency clock is swept and the outputs of the counters are read for a complete frequency band analysis.

Microprocessor based signal processing equipment need not be complex or slow. The method described here can make small microprocessor systems work well in difficult applications with no sacrifice of quality. This makes possible signal processing equipment which would not be possible without the use of this method.

Although particular embodiments of the invention have been described and illustrated herein, it is recognized that modifications and variations may readily occur to those skilled in the art. Consequently, it is intended that the claims be interpreted to cover such modifications and variations.

I claim:

1. A method for frequency spectrum analysis of an analog signal in real time based upon an assumed center frequency and sweeping said assumed center frequency by incrementally stepping it through different frequencies over a limited range in search of a center frequency that best matches a fundamental frequency of said analog signal, comprising the steps of sampling said analog signal at points corresponding to sine and cosine phases of each assumed center frequency, separately summing said sine and cosine samples into two integrals over an interval spanning a plurality of cycles of said analog signal for each assumed center frequency, and determining the frequency of said analog signal by determining which assumed center frequency produces the high integrals of said sine and cosine samples over said interval at each assumed center frequency.

2. A method as defined in claim 1 wherein said analog signal is first processed through a 1-bit analog-to-digital converter to produce a 1-bit level when said analog signal is of a predetermined polarity and a 0-bit level when said analog signal is of opposite polarity, and said samples are 1-bit samples having a binary value of 1 or 0 so that integration may be readily accomplished by counting up one unit for a bit 1 and counting down one unit for a bit 0 for each sine and cosine sample per cycle of said assumed center frequency during said sampling interval.

3. A method as defined in claim 2 wherein four of said samples are taken every cycle of said assumed center frequency to include not only sine and cosine phase samples but also −sine and −cosine phase samples per cycle of said assumed center frequency, inverting the sign of said −sine and −cosine samples to form with said sine and cosine samples four samples per cycle of said assumed center frequency at 90° intervals, and separately integrating said absolute sine and cosine samples.

4. Apparatus for frequency spectrum analysis of an analog signal in real time based upon assuming a center frequency, and sweeping said assumed center frequency by stepping it through different frequencies over a limited range in search of a frequency that best matches a fundamental frequency present in said analog signal, comprising means for converting said analog signal to a 1-bit digital signal having a bit-1 level when said analog signal is positive and a bit-0 level when said analog signal is negative, means for generating phase sampling clocks to time sampling of said analog signal converted to a 1-bit digital signal at points corresponding to plus and minus sine and plus and minus cosine phases of said assumed center frequency during a plurality of cycles of said assumed center frequency spanning a plurality of cycles of said analog signal of lowest frequency expected to be present in said limited range, means for separately integrating said plus and minus 1-bit digital sine and cosine samples over said sampling interval, and means for determining the frequency of said analog signal by detecting which assumed center frequency used for timing said sampling means achieves a highest integral of said sine and cosine samples over said sampling interval at each assumed center frequency after said assumed center frequency has been swept in steps over said limited range.

5. A method for frequency spectrum analysis of an analog signal in real time based upon an assumed center frequency and sweeping said assumed center frequency by incrementally stepping it through different frequencies over a limited range in search of a center frequency that best matches a fundamental frequency of said analog signal, comprising the steps of sampling said analog signals at points corresponding to sine and cosine phases of each assumed center frequency, separately summing said sine and cosine samples into two integrals over an interval spanning a plurality of cycles of said analog signal for each assumed center frequency, and determining the frequency of said analog signal by determining which assumed center frequency produces the highest integrals of said sine and cosine samples over said interval at each assumed center frequency, wherein said analog signal is first processed through a 1-bit analog-to-digital converter carried out by zero-crossing voltage comparison to provide a 1-bit level signal when said analog signal crosses from a negative to a positive and a 0-bit level signal when said analog signal crosses from a positive to a negative, and producing a bit-1 level signal between the times of detecting a crossing from negative to positive and a following crossing from positive to negative of said analog signal, and a bit-0 level signal between the times of detecting a crossing from positive to negative and a following crossing from negative to positive of said analog signal, thereby providing automatic gain control of said analog signals whose frequency is to be determined, wherein said analog signal is comprised of at least two signals at different frequencies summed together before analysis of the frequency of either signal, and analyses of the frequency of each of said two signals is carried out separately by sweeping an assumed center frequency for each simultaneously in separate channels, and wherein a reference signal of known center frequency and voltage amplitude is summed with said analog signal of unknown frequency, and analysis of said reference signal is carried out by timing samples in phase with said known center frequency while analysis of said two unknown signals are carried out by sweeping said assumed center frequency, and integrals of absolute sine and cosine samples for each of said two unknown signals and said reference signal are separately squared, and the squared sine and cosine integrals for each signal are separately summed to form a relative power measurement of each signal whereby the absolute power of said two unknown signals may be determined relative to the measure of power of said reference signal, the voltage amplitude of which is known.

6. A method for frequency spectrum analysis of an analog signal in real time based upon an assumed center frequency and sweeping said assumed center frequency by incrementally stepping it through different frequencies over a limited range in search of a center frequency that best matches a fundamental frequency of said analog signal, comprising the steps of sampling said analog signals at points corresponding to sine and cosine phases of each assumed center frequency, separately summing said sine and cosine samples into two integrals over an interval spanning a plurality of cycles of said analog signal for each assumed center frequency, and determining the frequency of said analog signal by determining which assumed center frequency produces the highest integrals of said sine and cosine samples over said interval at each assumed center frequency, wherein said analog signal is first processed through a 1-bit analog-to-digital converter carried out by zero-crossing voltage comparison to provide a 1-bit level signal when said analog signal crosses from a negative to a positive and a 0-bit level signal when said analog signal crosses from a positive to a negative, and producing a bit-1 level signal between the times of detecting a crossing from negative to positive and a following crossing from positive to negative of said analog signal, and a bit-0 level signal between the times of detecting a crossing from positive to negative and a following crossing from negative to positive of said analog signal, thereby providing automatic gain control of said analog signals whose frequency is to be determined, and wherein a reference signal of known center frequency and voltage amplitude is summed with said analog signal of unknown frequency, and analysis of said reference signal is carried out by timing samples in phase with said known center frequency while analysis of said unknown signal is carried out by sweeping said assumed center frequency, and wherein integrals of absolute sine and cosine samples for each of said two signals are separately squared, and the squared sine and cosine integrals for each signal are separately summed to form a relative power measurement of each, whereby the absolute power of said unknown signal may be determined relative to the measure of power of said known reference signal, the voltage amplitude of which is known.

7. A method as defined in claim 6 wherein the voltage amplitude of said unknown signal is determined by multiplying the known voltage amplitude of said reference signal by the ratio of power of said unknown signal to said power of said reference signal.

8. A method for frequency spectrum analysis of an analog signal in real time based upon an assumed center frequency and sweeping said assumed center frequency by incrementally stepping it through different frequencies over a limited range in search of a center frequency that best matches a fundamental frequency of said analog signal, comprising the steps of sampling said analog signals at points corresponding to sine and cosine phases of each assumed center frequency, separately summing said sine and cosine samples into two integrals over an interval spanning a plurality of cycles of said analog signal for each assumed center frequency, and determining the frequency of said analog signal by determining which assumed center frequency produces the highest integrals of said sine and cosine samples over said interval at each assumed center frequency, wherein said analog signal is first processed through a 1-bit analog-to-digital converter carried out by zero-crossing voltage comparison to provide a 1-bit level signal when said analog signal crosses from a negative to a positive and a 0-bit level signal when said analog signal crosses from a positive to a negative, and producing a bit-1 level signal between the times of detecting a crossing from negative to positive and a following crossing from positive to negative of said analog signal, and a bit-0 level signal between the times of detecting a crossing from positive to negative and a following crossing from negative to positive of said analog signal, thereby providing automatic gain control of said analog signals whose frequency is to be determined. and wherein a reference signal of known center frequency and voltage amplitude is summed with two signals of unknown frequency and amplitude before frequency analysis of any one signal, and analysis of said two unknown signals and said reference signal are carried out simultaneously by the same method in separate channels except that the assumed center frequency is not swept for the reference channel and is instead set at said known center frequency of said reference signal, and wherein integrals of absolute sine and cosine samples for each of said signals analyzed are separately squared, and the squared sine and cosine integrals for each signal are separately summed to form a relative power measurement of each, whereby the absolute power of each of said two unknown signals may be determined from the relative measure of power of the known reference signal using the known voltage amplitude of said reference signal.

9. A method as defined in claim 8 wherein the voltage amplitude of each of said two signals is determined by multiplying the known voltage amplitude of said reference signal by the ratio of power of each of said two signals to said power of said reference signal.

10. Apparatus as defined in claim 4 wherein said means for separately integrating said sine and cosine samples is comprised of means for counting up absolute sine samples equal to a bit 1 and to count down absolute sine samples equal to a bit 0, and means for counting up absolute cosine samples equal to a bit 1 and to count down absolute cosine samples equal to a bit 0.

11. Apparatus as defined in claim 10 wherein said means for counting absolute sine samples and said means for counting said absolute cosine samples are comprised of a sine up-down counter and cosine up-down counter, and means for controlling said sine up-down counter to count up samples of bit 1 value and to count down samples of bit 0 value in response to each of said plus and minus sine phase sample clocks and said cosine up-down counter to count up samples of bit 1 value and to count down samples of bit 0 value in response to each of said plus and minus cosine phase sample clocks.

* * * * *